United States Patent [19]

Shimizu et al.

[11] Patent Number: 4,931,308
[45] Date of Patent: Jun. 5, 1990

[54] PROCESS FOR THE PREPARATION OF FUNCTIONAL TIN OXIDE THIN FILMS

[75] Inventors: Isamu Shimizu; Masahiro Fushimi, both of Yokohama, Japan

[73] Assignee: Canon Kabushiki Kaisha, Tokyo, Japan

[21] Appl. No.: 33,190

[22] Filed: Apr. 2, 1987

[30] Foreign Application Priority Data

| Apr. 4, 1986 [JP] | Japan | 61-76621 |
| Apr. 4, 1986 [JP] | Japan | 61-76622 |
| May 21, 1986 [JP] | Japan | 61-114692 |
| May 28, 1986 [JP] | Japan | 61-120975 |

[51] Int. Cl.$^5$ ............................................. B05D 3/06
[52] U.S. Cl. ...................................... 427/39; 427/85; 427/86; 427/87; 427/126.3
[58] Field of Search ............... 427/38, 39, 35, 54.1, 427/74, 86, 87, 85, 126.3, 53.1, 255.1, 255.2, 255.3; 204/192.26, 192.29

[56] References Cited

U.S. PATENT DOCUMENTS

| 3,991,227 | 11/1976 | Carlson et al. | 427/39 |
| 3,991,228 | 11/1976 | Carlson et al. | 427/39 |
| 4,317,844 | 3/1982 | Carlson | 427/39 X |
| 4,505,950 | 3/1985 | Yamasaki | 427/38 |
| 4,522,663 | 6/1985 | Ovshinsky et al. | 427/39 X |
| 4,652,463 | 3/1987 | Peters | 427/53.1 |

Primary Examiner—Nam X. Nguyen
Attorney, Agent, or Firm—Fitzpatrick, Cella, Harper & Scinto

[57] ABSTRACT

Process for preparing a functional tin oxide thin film by reducing a raw material gas capable of contributing to formation of the tin oxide thin film either with the action of an excitation energy source such as high frequency, direct-current, microwave or light, or both with the action of such excitation energy source and the action of a reducing gas under reduced atmospheric inner pressure condition in a substantially enclosed reaction chamber containing the substrate upon which the tin oxide thin film is to be deposited, and oxidizing the resultant reduced active species with on oxidizing gas to thereby deposit the tin oxide thin film on the substrate at a low temperature and at high deposition rates without any significant powder.

9 Claims, 5 Drawing Sheets

PROCESS FOR THE PREPARATION OF FUNCTIONAL TIN OXIDE THIN FILMS

FIELD OF THE INVENTION

This invention relates to a process for preparing a functional tin oxide thin film which is desirably usable as a transparent electrode in solar cell or other electric devices such as liquid crystal display device, electrochromic display device and electroluminescent display, as infrared preventive member, as a solar selective absorber, as an antistatic member and as a transparent heating member in various devices.

BACKGROUND OF THE INVENTION

It is known that a tin oxide thin film ($SnO_2$ thin film) is transparent, conductive and chemically stabler than indium tin oxide film. And it is also known that the tin oxide thin film excels in light transmissive efficiency in the visible light region. In view of this, it is currently used as constituent members in various optical or/and electric devices.

Various methods for the preparation of such tin oxide thin film by means of spraying, thermal induced chemical vapor deposition, reactive sputtering etc. have been proposed.

Among those methods, the method of thermal induced chemical vapor deposition (hereinafter referred to as "CVD method") using tin tetrachloride ($SnCl_4$) as a raw material is widely used in various applications. Under this method, the preparation of a tin oxide thin film is conducted in accordance with pyrolysis oxidation reaction or hydrolysis reaction which can be expressed by the following reaction formulas:

Pyrolysis oxidation reaction:
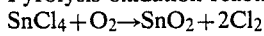
$$SnCl_4 + O_2 \rightarrow SnO_2 + 2Cl_2$$
and
hydrolysis reaction:
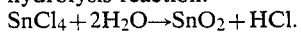
$$SnCl_4 + 2H_2O \rightarrow SnO_2 + HCl.$$

And the known CVD method for the preparation of a tin oxide film is generally implemented using such apparatus as schematically shown in FIG. 7, in which are shown carrier gas feeding pipe 1, flow meter 2, stop valves 3, 3', raw material vessel provided with an appropriate heating means (not shown), pressure gage 5, flow controlling valve 6, raw material gas supplying pipe 7, oxidizing gas supplying pipe 8, reaction vacuum chamber 9, substrate holder 10 having electric heater 10', substrate 11 and exhaust pipe 12.

The operation of forming a $SnO_2$ thin film in the apparatus of FIG. 7 is carried out in the following way. That is, since $SnCl_4$ as a film forming raw material is in liquid state at room temperature, carrier gas such as He gas is introduced into the $SnCl_4$ liquid in the raw material vessel 4 so that the $SnCl_4$ liquid being kept at a predetermined temperature may be bubbled with He gas (carrier gas) to provide a gas containing $SnCl_4$. The resultant $SnCl_4$ containing gas is successively introduced through the raw material gas supplying pipe 7 into the reaction vacuum chamber 9. In parallel, oxidizing gas such as $O_2$ or $H_2O$ is introduced through the oxidizing gas supplying pipe 8 into the reaction vacuum chamber 9. The thus introduced $SnCl_4$ containing gas and oxidizing gas are engaged in the above mentioned pyrolysis oxidation reaction or hydrolysis reaction to thereby result in forming a tin oxide film on the substrate 11 being kept at a predetermined temperature by the action of the electric heater 10'. However, the known method is problematical due to the fact that it is practiced under elevated temperature conditions and other problems are associated not only with the elevated temperature conditions but also with the apparatus to be used. That is, because the known method is practiced while maintaining a substrate at an elevated temperature, firstly the kind of a substrate to be used is limited to one that has a sufficient heat resistance and that does not contain a material which can migrate and case changes in the characteristics of a layer to be formed on the substrate. Then, should such selected substrate be used, the layer to be formed is apt to be damaged with the action of heat, undesired side-reactions are apt to be caused between the substrate and a layer to be formed, whereby changes are brought about in the characteristics and the thickness of a layer to be formed is likely to be varied, whereby the resulting layer lacks uniformity of the thickness and homogeneity of the composition, which may itself also cause changes in the characteristics.

In this regard, even if a desirable tin oxide thin film should be fortunately obtained, the thin film will become costly.

Against this background, there is now an increased demand for providing a method that makes it possible to practice the process at low temperature and at a high film forming rate in a simple apparatus to mass-produce a desirable tin oxide thin film which has good uniformity and has practically applicable characteristics.

SUMMARY OF THE INVENTION

The present inventors have conducted extensive studies in order to solve the problems in the aforementioned known method and in order to develop an improved process for effectively and simply preparing a functional tin oxide thin film having a wealth of many practically applicable characteristics which is suited for use as a constituent member in solar cell or other electric devices such as liquid crystal display device, electrochromic display device and electroluminescent display, and also as a solar selective absorber, as an antistatic member and as a transparent heating member in various devices.

As a result, the present inventors have finally found a method that enables efficient and stable preparation of a desirable functional tin oxide thin film according to the improved procedures detailed below.

It is therefore an object of this invention to provide an improved tin oxide thin film in high quality which is excellent in crystallinity and has practically applicable characteristics.

Another object of this invention is to provide an improved process that enables mass-production of said tin oxide thin film while maintaining the characteristics of the layer to be formed and promoting the deposition rate at low temperature.

A further object of this invention is to provide an apparatus suitable for practicing said process.

In accordance with this invention, the process includes the steps of reducing at least one raw material gas capable of contributing to formation of the tin oxide thin film either with the action of an excitation energy source such as high frequency, direct-current, microwave or light, or both with the action of such excitation energy source and the action of a reducing gas under reduced atmospheric inner pressure condition in a substantially enclosed reaction chamber containing the substrate upon which the tin oxide thin film is to be deposited, and oxidizing the resultant reduced active species with an oxidizing gas to thereby deposit the tin oxide thin film on the substrate at a low temperature and at high deposition rates without any significant powder. The excitation energy and the raw material gases form reduced active species within the reaction chamber which react with the oxidizing gas and form the tin oxide thin film on the substrate.

A first embodiment of this invention comprises feeding a film forming raw material gas and an oxidizing gas into region where an excitation energy is applied in a reaction vacuum chamber, carrying out the reduction of the film forming raw material to generate reduced active species with the action of the excitation energy to be applied and the oxidation of the reduced active species with the oxidizing gas concurrently, and forming the tin oxide thin film on the substrate.

A second embodiment of this invention comprises feeding a film forming raw material gas and a reducing gas into a region where an excitation energy is applied in a reaction vacuum chamber, reducing the film forming raw material with the actions of the excitation energy to be applied and the reducing gas to generate reduced active species, transporting the reduced active species to the region near the substrate into which an oxidizing gas is fed, and oxidizing the reduced active species with the oxidizing gas to be fed to thereby form the tin oxide thin film on the substrate.

A third embodiment of this invention is modification of the first embodiment which is characterized in that the film forming raw material gas and the oxidizing gas are fed into the region surrounded by electrodes by which the excitation energy is applied whereby the reduced active species are generated and the reduced active species are transported toward the substrate while being oxidized with the oxidizing gas to thereby form the tin oxide thin film on the substrate.

A fourth embodiment of this invention is modification of the third embodiment which is characterized in that the surface of the substrate upon which the tin oxide thin film to be formed is capped with a screen member such as metallic screen member so that it may be protected from being influenced by electrons and ion particles caused by plasmas in the film forming process.

A fifth embodiment of this invention comprises feeding the film forming raw material gas and a dopant imparting raw material into the upstream region of a reaction vacuum chamber where an excitation energy is applied to reduce the two kinds of raw materials with the action of the excitation energy whereby reduced active species are generated, liberating an oxidizing gas into the downstream region situated behind the substrate and oxidizing the reduced active species being transported toward the substrate with the oxidizing gas being moved up to thereby form a doped thin oxide thin film on the substrate.

The film forming raw material can include $SnCl_4$, $Sn(CH_3)_4$ and $Sn(C_2H_5)_4$. Among these compounds, $SnCl_4$ is the most desirable. And, in the case where $SnCl_4$ is used as the film forming raw material, it is gasified prior to introduction into the reaction chamber by blowing a rare gas such as He gas, Ar gas or Ne gas into a liquid of $SnCl_4$ being kept at a predetermined temperature to thereby cause a gas containing $SnCl_4$ which is successively introduced into the reaction chamber. To the foregoing, dopants, either p-type or n-type can be added to the film forming raw material gas to form p-type or n-type tin oxide thin films. Usable as such dopant imparting raw material are, for example, $SbCl_5$, $PH_3$, $C_2F_3Cl_3$, $F_2$ and $NH_2$.

The oxidizing gas can include $O_2$ gas, $H_2O$ gas (steam) and $CO_2$ gas. The reducing gas is represented by $H_2$ gas.

DESCRIPTION OF THE PREFERRED EMBODIMENTS

Figure 1:
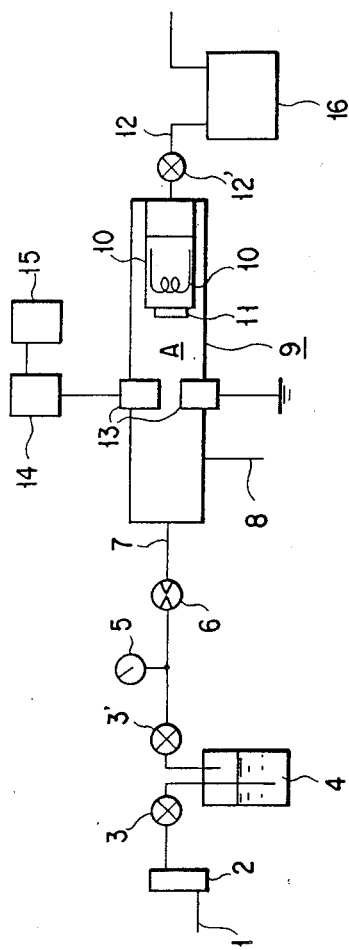
FIG. 1 is a schematic diagram of the apparatus suitable for carrying out the first embodiment of this invention to prepare a tin oxide thin film using a film forming raw material gas and an oxidizing gas.

The embodiments of the process according to this invention will be hereunder more detailed referring to the drawings.

The apparatus shown in FIG. 1 suitable for carrying out the first embodiment of this invention which comprises film forming raw material vessel 4 to gasify a film forming raw material such as $SnCl_4$ and reaction vacuum chamber 9 containing a substrate 11 upon which the tin oxide thin films are to be deposited.

The vessel 4 is provided with a carrier gas (rare gas) feeding pipe 1 having a flow meter 2 and a stop valve 3 which is connected to a carrier gas reservoir (not shown) at its one end and is extended into the film forming raw material at its opposite end so that the $SnCl_4$ liquid as the film forming raw material being maintained at a predetermined temperature with the action of a heating means (not shown) may be bubbled with the carrier gas to cause a gas containing $SnCl_4$. The resultant film forming raw material gas is successively fed through a raw material gas supplying pipe 7 having stop valve 3′, pressure gage 5 and flow controlling valve 6 which is open into the inner space of the reaction vacuum chamber 9 through its upper wall.

The inlet portion of the raw material gas supplying pipe 7 is somewhat extended into the inner space of the reaction vacuum chamber 9 and is sealed at the extreme end. And there are provided a plurality of gas liberation holes with the circumferential wall of the extended portion of the pipe 7 being situated in the reaction vacuum chamber 9 so that the film forming raw material gas are supplied through the gas liberation holes toward the inner wall face of the reaction vacuum chamber 9. (This part is not shown).

With the side wall of the reaction vacuum chamber 9, there is provided an oxidizing gas supplying pipe 8 which is open into the inner space. The inlet portion of oxidizing supplying pipe 8 is also somewhat extended into the inner space of the reaction vacuum chamber 9, sealed at the extreme end and the circumferential wall of the extended pipe portion being situated in the reaction vacuum chamber 9 is provided with a plurality of gas liberation holes so that the oxidizing gas may be dispersedly supplied and well mixed with the film forming material gas. (This part is not shown.)

13, 13 are electrodes being electrically grounded which is electrically connected through matching box 14 to a power source 15 such as high frequency power source which supplies an excitation energy to reduce the film forming material gas to be reduced active species and to promote the oxidation reaction of the reduced active species with the oxidizing gas resulting in formation of a tin oxide film on the substrate 11 placed on substrate holder 10 having a heater 10'. The other side wall of the reaction vacuum chamber 9 is provided with an exhaust pipe 12 having an exhaust valve 12' being connected to exhaust pump 16.

The process for preparing a tin oxide thin film using the apparatus shown in FIG. 1 according to this invention is carried out in the following way. That is, a substrate such as a glass plate is firmly attached to the surface of the substrate holder 10. The air in the reaction vacuum chamber 9 is evacuated by opening the exhaust valve 12' and operating the exhaust pump 16 to bring the inner space A to a vacuum of less than $1 \times 10^{-2}$ Torr. Then the heater 10' is activated to uniformly heat the substrate to about 200° C. and the substrate is maintained at that temperature. At the same time, $SnCl_4$ in liquid state as the film forming material being stored in the raw material vessel 4 is bubbled to cause a gas containing $SnCl_4$ by introducing a rare gas (carrier gas) such as He gas, Ar gas or Ne gas thereinto. The resultant film forming raw material gas is dispersedly fed into the reaction vacuum chamber 9 through the raw material gas supplying pipe 7 while controlling its flow rate by regulating the flow controlling valve 6. Concurrently, an oxidizing gas such as $O_2$ gas, $H_2O$ gas (steam) or $CO_2$ gas is dispersedly fed into the reaction vacuum chamber 9 through the oxidizing gas supplying pipe 8 while controlling its flow rate. After the flow rates of the two kinds of gases become stable, the power source 15 for a discharge energy of high frequency, direct-current or microwave is switched on to apply said energy between the electrodes 13 and 13 while controlling the power of the discharge energy to be applied by regulating the matching box 14 whereby the raw material gas are reduced with the action of the discharge energy to generate reduced active species followed by being oxidized with the oxidizing gas during the moving process of the reduced active species toward the substrate which results in forming a desirable tin oxide thin film on the substrate.

Figure 2:
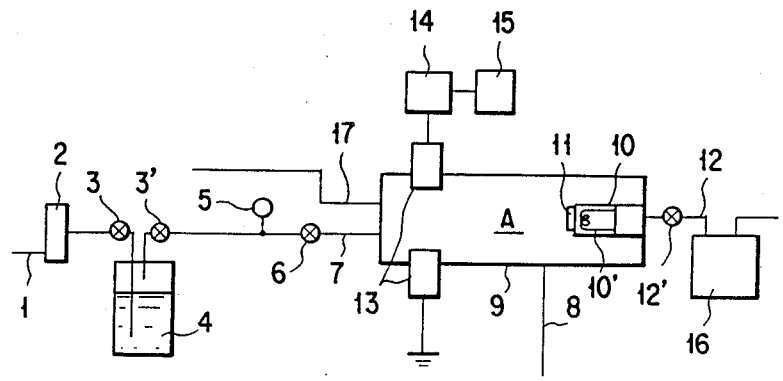
FIG. 2 is a schematic diagram of the apparatus suitable for carrying out the second embodiment of this invention to prepare a thin oxide thin film using a film forming raw material gas, a reducing gas and an oxidizing gas.

The apparatus shown in FIG. 2 is suited for carrying out the second embodiment of this invention. In this apparatus, a reducing gas supplying pipe 17 is provided with the side wall of the reaction vacuum chamber 9 with which the film forming raw material gas supplying pipe 7 is also provided. The inlet portion of the reducing gas supplying pipe 17 into the inner space A has the same structure as that of the film forming raw material gas supplying pipe 7 or that of the oxidizing gas supplying pipe 8 as explained in the case of the apparatus shown in FIG. 1. And, the electrodes 13 and 13 are situated in the upstream side and the oxidizing gas supplying pipe 8 is provided with the circumferential wall situated in the downstream side wherein the substrate is placed. In the apparatus shown in FIG. 2, the film forming raw material gas and $H_2$ gas as the reducing gas are concurrently fed through the pipes 7 and 17 dispersedly into the region surrounded by the electrodes 13 and 13 and the film forming raw material is reduced with the action of the discharge energy and the $H_2$ gas to thereby generate well-reduced active species. The reduced active species are successively moving toward the substrate 11 and oxidized with the oxidizing gas to be dispersedly fed through the oxidizing gas supplying pipe 8 near the substrate to thereby bring about the formation of a desirable tin oxide thin film on the substrate at a high film forming rate.

Figure 3:
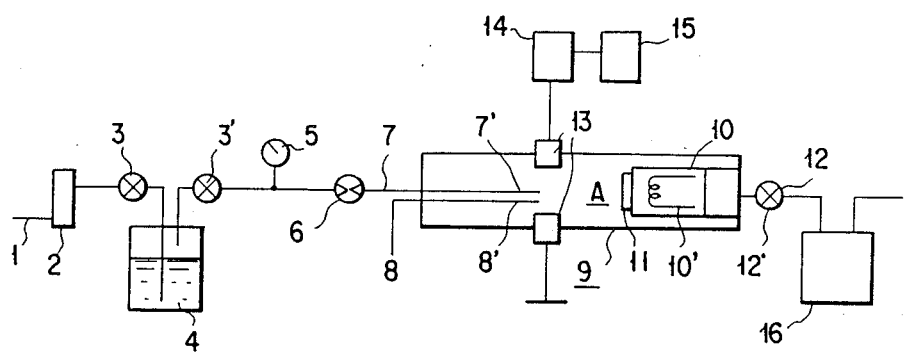
FIG. 3 is a schematic diagram of partial modification of the apparatus shown in FIG. 2 which is suited for carrying out the third embodiment of this invention.

The apparatus shown in FIG. 3 is suited for carrying out the third embodiment of this invention and which is modification of the apparatus shown in FIG. 1 in which the electrodes 13 and 13 are situated in the downstream region of the inner space A near the substrate 11 and the film forming raw material supplying pipe 7 and the oxidizing gas supplying pipe 8 are extended and open into the region surrounded the electrodes 13 and 13 as expressed by numerals 7' and 8' respectively.

Figure 4:
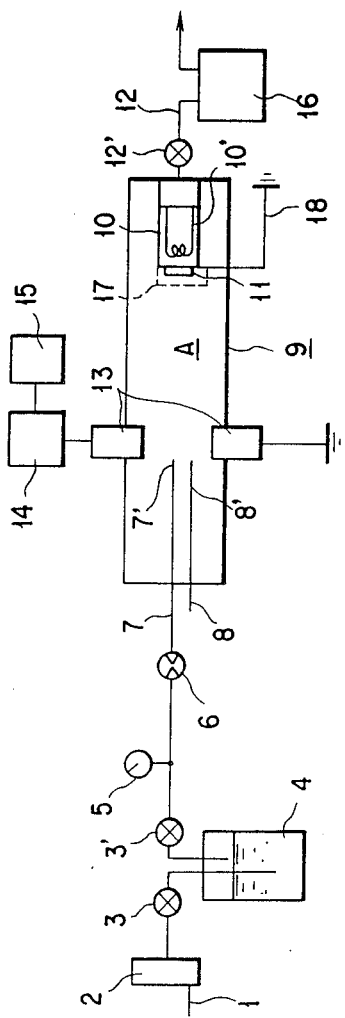
FIG. 4 is a schematic diagram of partial modification of the apparatus shown in FIG. 3 which is suited for carrying out the fourth embodiment of this invention.
Figure 5:
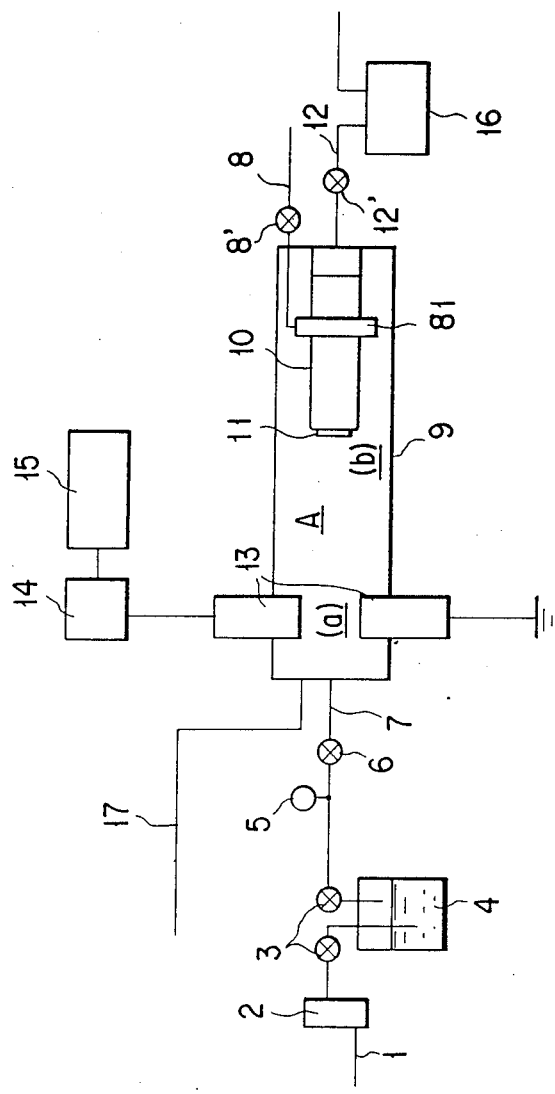
FIG. 5 is a schematic diagram of the apparatus suitable for carrying out the fifth embodiment of this invention to form a doped tin oxide thin film.
Figure 6:
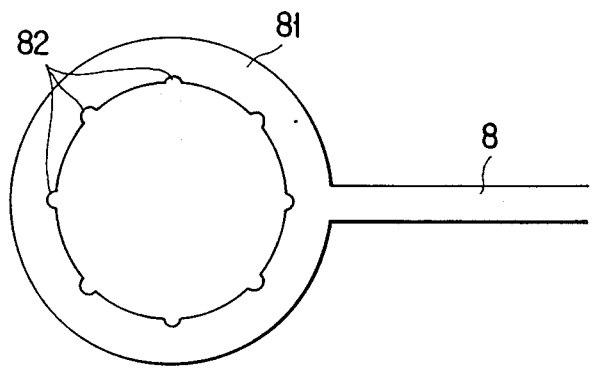
FIG. 6 is a schematic diagram of gas liberation ring 81 in the apparatus shown in FIG. 5.
Figure 7:
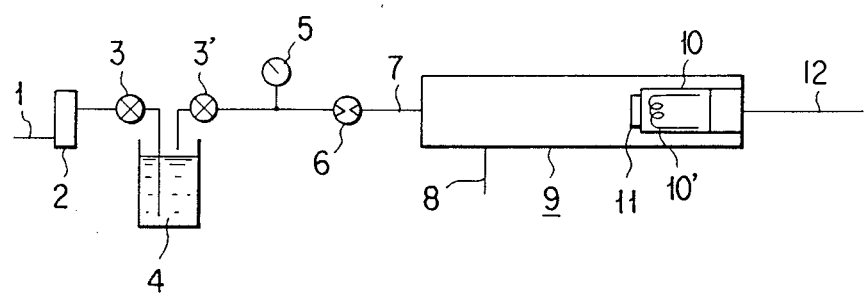
FIG. 7 is a schematic diagram of the known apparatus for the formation of a tin oxide film.

In the process of this invention using the apparatus shown in FIG. 3, the using efficiencies of the film forming raw material gas and the oxidizing gas are desirably increased to thereby form a desirable tin oxide thin film on the substrate at a high film forming rate. The apparatus shown in FIG. 4 is suited for carrying out the fourth embodiment of this invention and which is modification of the apparatus shown in FIG. 3 in which the substrate 11 is protected by a metallic mesh cover 18 having, for example, 30 holes per 1 $cm^2$. The mettalic mesh cover 18 is grounded by an electric wire 19 to be zero electric potential. In the process of this invention using the apparatus shown in FIG. 4, a tin oxide thin film of high film quality which has a desired smooth and even surface and which has an uniform layer thickness can be formed since the surface of the substrate 11 is always protected from being influenced by electrons and ion particles during the film forming process. The apparatus shown in FIG. 5 is suited for carrying out the fifth embodiment of this invention. In this apparatus, a dopant imparting raw material gas supplying pipe 17 is provided with the side wall of the reaction vacuum chamber 9 with which the film forming raw material gas supplying pipe 7 is also provided. The inlet portion of the dopant imparting raw material gas supplying pipe 17 and that of the film forming raw material gas supplying pipe 7 into the inner space A have the same structures as those of the oxidizing gas supplying pipe 8 and the film forming raw material gas supplying pipe 7 as in the foregoing apparatus shown in FIG. 1. And the electrodes 13 and 13 are situated in the upstream side. On the other hand, the means for feeding the oxidizing gas into the inner space A comprises a gas liberation ring 81 having a plurality of gas liberation holes 82, 82, . . . as shown in FIG. 6 which is connected to the oxidizing gas supplying pipe 8. And the gas liberation ring 81 is situated in the down stream side and behind the substrate 11, and it is installed to surround the substrate holder 10. Each of the gas liberation holes 82, 82, . . . . is desired to have such an angle that the oxidizing gas to be liberated through that hole into the inner space A may be dispersedly liberated against the circumferential wall face of the substrate holder 10. The process for preparing a doped tin oxide thin film using the apparatus shown in FIG. 5 in this invention is carried out in the following way. That is, a substrate such as a glass plate is firmly attached to the surface of the substrate holder 10. The air in the reaction vacuum chamber 9 is evacuated by opening the exhaust valve 12' and operating the exhaust pump 16 to bring the inner space A to a vacuum of less than $1\times10^{-2}$ Torr. Then the heater (not shown) of the substrate holder 10 is activated to uniformly heat the substrate to about 200° C. and the substrate is maintained at that temperature. At the same time, $SnCl_4$ in liquid state as the film forming raw material being stored in the raw material vessel 4 is bubbled to cause a gas containing $SnCl_4$ by blowing a rare gas (carrier gas) such as He gas, Ar gas or Ne gas thereinto. The film forming raw material gas is dispersedly fed into the region (a) through the raw material gas supplying pipe 7 while controlling its flow rate by regulating the flow controlling valve 6. Concurrently, a dopant imparting raw material gas containing $SbCl_5$, $PH_3$, $C_2F_3Cl_3$, $F_2$ or $NH_3$ is dispersedly fed into the region (a) through the dopant imparting raw material gas supplying pipe 17 while controlling its flow rate. In parallel, an oxidizing gas such as $O_2$ gas, $H_2O$ gas (steam) or $CO_2$ gas is fed through the gas liberation holes 82, 82, . . . of the oxidizing gas feeding ring 81 so as to make the oxidizing gas to be liberated against the outer wall face of the substrate holder 10 and to permit the thus liberated gas to ascend into the region (b) by controlling its flow rate and the related inner pressure conditions.

After the flow rates of the three kinds of gases become stable, the inner pressure of the inner space is adjusted to preferably 0.01 to 20 Torr, more preferably 0.1 to 2.0 Torr, most preferably 0.65 Torr by regulating the exhaust valve 12' of the exhaust pipe 12. Then, the power source 15 is switched on to apply a discharge energy of preferably 15 to 100 W or most preferably 50 W between the electrodes 13 and 13 to thereby reduce both the film forming raw material gas and the dopant imparting raw material gas whereby reduced active species are generated from them. The reduced active species are successively moving toward the substrate 11. And they are continuously contacted with and oxidized with the oxidizing gas being evenly dispersed in the region (b) surrounding the substrate to thereby result in forming a desirable doped tin oxide thin film on the substrate.

PREFERRED EMBODIMENT OF THE INVENTION

The advantages of this invention are now described in more detail by reference to the following Examples, which are provided merely for illustrative purposes only, and are not intended to limit the scope of this invention.

Example 1

A tin oxide thin film was prepared using the apparatus shown in FIG. 1.

As the substrate 11, a Corning's No. 7059 glass plate (product of Corning Glass Works) was used. The glass plate was treated with a 1% solution of NaOH, washed with water, and then air-dried. Then this glass plate was firmly attached to the surface of the substrate holder 10 in the reaction vacuum chamber 9. The air in the reaction vacuum chamber 9 was evacuated by opening the valve of the exhaust pipe 12 and operating the vacuum pump 16 to bring the inner space of the reaction vacuum chamber to a vacuum of less than $1\times10^{-2}$ Torr. Then the heater 10' was activated to uniformly heat the glass plate substrate 11 to and maintained at about 200° C.

At the same time, the $SnCl_4$ liquid being kept at about 40° C. in the raw material vessel 4 was bubbled to cause a gas containing $SnCl_4$ by introducing He gas through the carrier gas feeding pipe 1 at a flow rate of 40 SCCM thereinto. The resultant film forming raw material gas was successively fed through the raw material gas supplying pipe 7 into the reaction vacuum chamber 9 while controlling the flow rate to about $10^{-4}$ mol/min. by regulating the flow controlling valve 6. In parallel, $O_2$ gas (oxidizing gas) was fed through the oxidizing gas supplying pipe 8 at a flow rate of 30 SCCM into the reaction vacuum chamber 9. After the flow rates of the two kinds of gases became stable, the high frequency power source 15 was switched on to apply a discharge energy of 40 W between the electrodes 13 and 13.

After this state maintained for 5 hours, there was formed a thin film of tin oxide in an uniform thickness of about 1.0 μm on the glass plate substrate.

As a result of examining the sheet resistance per 1 $cm^2$ and the transmittance in the visible light region of the resultant tin oxide thin film, it was found that they were 10 Ω/□ and more than 80% respectively.

Example 2

A tin oxide thin film was prepared using the apparatus shown in FIG. 2.

In this example, there were used He gas as a carrier gas, $SnCl_4$ as a film forming raw material, $H_2$ gas as a reducing gas and $O_2$ gas as an oxidizing gas respectively.

A Corning's No. 7059 glass plate of which surface was absolutely cleaned as in Example 1 was used as the substrate 11.

The glass plate was firmly attached to the surface of the substrate holder 10 in the reaction vacuum chamber 9. The air in the reaction vacuum chamber 9 was evacuated by opening the valve of the exhaust pipe 12 and operating the vacuum pump 16 to bring the inner space of the reaction vacuum chamber to a vacuum of less than $1\times10^{-2}$ Torr. Then the heater 10' was activated to uniformly heat the glass plate substrate 11 to and maintained at about 200° C.

At the same time, the $SnCl_4$ liquid being kept at about 40° C. in the raw material vessel 4 was bubbled to cause a gas containing $SnCl_4$ by introducing He gas through the carrier gas feeding pipe 1 at a flow rate of 40 SCCM thereinto. The resultant film forming raw material gas was successively fed through the raw material gas supplying pipe 7 into the reaction vacuum chamber 9 while controlling the flow rate to about $10^{-4}$ mol/min. by regulating the flow controlling valve 6. Simultaneously, $H_2$ gas (reducing gas) was fed through the reducing gas supplying pipe 17 at a flow rate of 15 SCCM into the reaction vacuum chamber 9. In parallel, $O_2$ gas (oxidizing gas) was fed through the oxidizing gas supplying pipe 8 at a flow rate of 30 SCCM into the reaction vacuum chamber 9. After the flow rates of the three kinds of gases became stable, the high frequency power source 15 was switched on to apply a discharge energy of 40 W between the electrodes 13 and 13.

Wherein, it was found that in the region near the electrodes 13 and 13 the reductions of $SnCl_4$ with $H_2$. principally occurred because of slight presence of $O_2$ and in the region around the substrate 11 the oxidation of the reduced substances principally occurred because of slight presence of $H_2$.

After this state maintained for 6 hours, there was formed a tin oxide thin film in an uniform thickness of 1.3 μm on the glass plate substrate.

As a result of examining the sheet resistance per 1 cm² and the transmittance of in the visible light region the resultant tin oxide thin film, it was found that they were 10 Ω/□ and more than 82.0% respectively.

Example 3

A tin oxide thin film was prepared using the apparatus shown in FIG. 3.

In this example, there were used He gas as a carrier gas, $SnCl_4$ as a film forming raw material, and $O_2$ gas as an oxidizing gas respectively.

A Corning's No. 7059 glass plate of which surface was absolutely cleaned as in Example 1 was used as the substrate 11.

The glass plate was firmly attached to the surface of the substrate holder 10 in the reaction vacuum chamber 9. The air in the reaction vacuum chamber 9 was evacuated by opening the valve of the exhaust pipe 12 and operating the vacuum pump 16 to bring the inner space A of the reaction vacuum chamber to a vacuum of less than $1 \times 10^{-2}$ Torr. Then the heater 10' was activated to uniformly heat the glass plate substrate 11 to and maintained at about 230° C.

At the same time, the $SnCl_4$ liquid being kept at about 40° C. in the raw material vessel 4 was bubbled to cause a gas containing $SnCl_4$ by introducing He gas through the carrier gas feeding pipe 1 at a flow rate of 40 SCCM thereinto. The resultant film forming raw material gas was successively fed through the raw material gas supplying pipe 7 and the spray nozzle 7' into the region near the electrodes 13 and 13 in the reaction vacuum chamber 9 while controlling the flow rate to about $10^{-4}$ mol/min. by regulating the flow controlling valve 6. At the same time, $O_2$ gas was fed through the oxidizing gas supplying pipe 8 and the spray nozzle 8' at a flow rate of 30 SCCM into the region near the electrodes 13 and 13 in the reaction vacuum chamber 9. After the flow rates of the two kinds of gases became stable, the high frequency power source 15 was switched on to apply a discharge energy of 30 W between the electrodes 13 and 13, wherein there was observed generation of a blue luminescence from the area where the gases were supplied through the area near the glass plate substrate. The film formation proceeded by a film forming rate of 150 Å, about 5 times faster as much as that in the known method, to thereby form a desirable tin oxide thin film of 1.0 μm in uniform thickness on the glass plate substrate.

As a result of examining the sheet resistance per 1 cm² and the transmittance in the visible light region of the resultant tin oxide thin film, it was found that they were 10 Ω/□ and more than 84% respectively.

Example 4

In this example, the apparatus shown in FIG. 4 having a metallic mesh cover with a 30 holes per 1 cm² being grounded by the electric wire 19 to be zero electric potential as the substrate mesh cover 18 was used to prepare a tin oxide thin film.

And there were used He gas as a carrier gas, $SnCl_4$ as a film forming raw material and $0_2$ gas as an oxidizing gas respectively.

A Corning's No. 7059 glass plate of which surface was absolutely cleaned as in Example 1 was used as the substrate 11.

The glass plate was firmly attached to the surface of the substrate holder 10 and covered by the metallic mesh substrate cover 17. The air in the reaction vacuum chamber 9 was evacuated by opening the valve of the exhaust pipe 12 and operating the vacuum pump 16 to bring the inner space A of the reaction vacuum chamber to a vacuum of less than $1 \times 10^{-2}$ Torr. Then the heater 10' was activated to uniformly heat the glass plate substrate 11 to and maintained at about 200° C.

At the same time, the $SnCl_4$ liquid being kept at about 40° C. in the raw material vessel 4 was bubbled to cause a gas containing $SnCl_4$ by introducing He gas through the carrier gas feeding pipe 1 at a flow rate of 40 SCCM thereinto. The resultant film forming raw material gas was successively fed through the raw material gas supplying pipe 7 and the spray nozzle 7' into the region near the electrodes 13 and 13 in the reaction vacuum chamber 9 while controlling the flow rate to about $10^{-4}$ mol/min. by regulating the flow controlling valve 6. At the same time, $O_2$ gas was fed through the oxidizing gas supplying pipe 8 and the spray nozzle 8' at a flow rate of 30 SCCM into the region near the electrodes 13 and 13 in the reaction vacuum chamber 9. After the flow rates of the two kinds of gases became stable, the high frequency power source 15 was switched on to apply a discharge energy of 30 W between the electrodes 13 and 13, wherein there was observed generation of a blue luminescence from the area where the gases were supplied through the area near the glass plate substrate.

After this state maintained for 5 hours, there was formed a tin oxide thin film being excellent in film quality which has a desired smooth and even surface and which has a layer in an uniform thickness of 1.0 μm.

As a result of examining the sheet resistance per 1 cm² and the transmittance in the visible light region of the resultant film, it was found that they were 10 KΩ/□ and more than 85.0% respectively.

Example 5

A tin oxide thin film doped with a dopant was prepared using the apparatus shown in FIG. 5.

In this example, there were used He gas as a carrier gas, $SnCl_4$ as a film forming raw material, $SbCl_5$ as a dopant imparting raw material and $O_2$ gas as an oxidizing gas respectively.

A Corning's No. 7059 glass plate of which surface was absolutely cleaned as in Example 1 was used as the substrate 11.

The glass plate was firmly attached to the surface of the substrate holder 10 in the reaction vacuum chamber 9. The air in the reaction vacuum chamber 9 was evacuated by opening the valve of the exhaust pipe 12 and operating the vacuum pump 16 to bring the inner space A of the reaction vacuum chamber to a vacuum of less than $1 \times 10^{-2}$ Torr. Then the heater was activated to uniformly heat the glass plate substrate 11 to and maintained at about 200° C.

At the same time, the $SnCl_4$ liquid being kept at about 40° C. in the raw material vessel 4 was bubbled to cause a gas containing $SnCl_4$ by introducing He gas through the carrier gas feeding pipe 1 at a flow rate of 40 SCCM thereinto. The resultant film forming raw material gas was successively fed through the gas liberation holes of the raw material gas supplying pipe 7 into the reaction vacuum chamber 9 while controlling the flow rate to about $10^{-4}$ mol/min. by regulating the flow controlling valve 6. And a dopant imparting raw material gas containing $SbCl_5$ was fed at a 3% gas flow ratio versus the $SnCl_4$ through the dopant imparting raw material gas supplying pipe 17 into the reaction vacuum chamber 9.

In parallel, $O_2$ gas was fed into the reaction vacuum chamber at a flow rate of 5 SCCM through the gas liberation holes 82, 82, . . . . of the oxidizing gas feeding ring 81 so as to permit $O_2$ gas to be liberated against the outer wall face of the substrate holder 10.

After the flow rates of the three kinds of gases became stable, the inner pressure of the inner space A of the reaction vacuum chamber 9 was adjusted to 0.6 Torr by regulating the exhaust valve 12' of the exhaust pipe 12. Then the high frequency power source 15 was switched on to apply a discharge energy of 100 W between the electrodes 13 and 13. Wherein there was observed that reduction of the film forming raw material gases principally occurred in the region (a) near the electrodes 13 and 13 and oxidation of the reduced substances with $O_2$ gas principally occurred in the region (b) near the substrate 11.

After this state maintained for 30 minutes, there was formed a tin oxide thin film of a high film quality which has a desired smooth and even surface and which has a layer in an uniform thickness of 5000Å.

As a result of having various evaluations on the resultant film, it was found that the film is excellent in crystallinity and is structually minute.

As a result of examining the transmittance in the visible light region and the conductivity on the resultant tin oxide thin film, it was found that they were more than 85% and 300 $Scm^{-1}$.

What is claimed is:

1. A process for preparing a functional tin oxide thin film on a substrate in a substantially enclosed reaction vacuum chamber, comprising:
   (i) forming a reduced active species by feeding a tin-containing raw material gas (A) including a rare gas as a carrier and a reducing gas (B) into a first region of said reaction vacuum chamber, allowing both gases (A) and (B) to mix, and applying discharge energy to form said reduced active species;
   (ii) transporting said reduced active species into a second region of said reaction vacuum chamber in which said substrate is positioned and maintained at a temperature up to 230° C. sufficient to provide said tin oxide film having uniformity of thickness and homogeneity of composition; and
   (iii) introducing an oxidizing gas (C) into said second region to mix and chemically react with said reduced active species and effect the formation of said tin oxide film.

2. The process according to claim 1, wherein said tin-containing raw material gas (A) also includes raw material capable of imparting a p-type or n-type dopant.

3. The process according to claim 2 wherein said dopant imparting raw material is a member selected from the group consisting of $SbCl_5$, $PH_3$, $C_2F_3Cl_3$, $F_2$, and $NH_2$.

4. The process according to claim 1, wherein the substrate is protected with an electrically grounded metallic mesh cover.

5. The process according to claim 1, wherein said tin containing raw gas (A) is selected from the group consisting of $SnCl_4$, $Sn(CH_3)_4$, and $Sn(C_2H_5)_4$.

6. The process according to claim 1, wherein said reducing gas (B) is $H_2$.

7. The process according to claim 1, wherein said rare gas is selected from the group consisting of He, Ar, and Ne.

8. The process according to claim 1, wherein said oxidizing gas (C) is selected from the group consisting of $O_2$, $H_2O$, and $CO_2$.

9. A process for preparing a functional tin oxide thin film on a substrate in a substantially enclosed reaction vacuum chamber, comprising:
   (i) forming a reduced active species by feeding a tin-containing raw material gas (A) including $SnCl_4$ and a rare gas as a carrier, said rare gas selected from the group consisting of He, Ar, and Ne, and a reducing gas (B) comprising $H_2$ into a first region of said reaction vacuum chamber, allowing both gases (A) and (B) to mix, and applying discharge energy to form said reduced active species;
   (ii) transporting said reduced active species into a second region of said reaction vacuum chamber in which said substrate is positioned and maintained at a temperature of about 200° C.; and
   (iii) introducing an oxidizing gas (C) selected from the group consisting of $O_2$, $H_2O$, and $CO_2$ into said second region to mix and chemically react with said reduced active species and effect the formation of said tin oxide film.

* * * * *

UNITED STATES PATENT AND TRADEMARK OFFICE
CERTIFICATE OF CORRECTION

PATENT NO. : 4,931,308
DATED : June 5, 1990
INVENTOR(S) : ISAMU SHIMIZU, ET AL.                Page 1 of 3

It is certified that error appears in the above-identified patent and that said Letters Patent is hereby corrected as shown below:

On the title page;

IN [30] FOREIGN APPLICATION PRIORITY DATA

Insert --Mar. 26, 1987  [JP]  Japan ....... 62-72714--.

IN [56] REFERENCES CITED

U.S. PATENT DOCUMENTS, "Yamasaki" should read --Yamazaki--.

IN [57] ABSTRACT

Line 11, "on" should read --an--.

COLUMN 1

Line 52, "Sncl$_4$" should read --SnCl$_4$--.

COLUMN 2

Line 10, "case" should read --cause--.

COLUMN 4

Line 2, "material" should read --materials--.
   Line 64, "are" should read --is--.

UNITED STATES PATENT AND TRADEMARK OFFICE
CERTIFICATE OF CORRECTION

PATENT NO. : 4,931,308

DATED : June 5, 1990

INVENTOR(S) : ISAMU SHIMIZU, ET AL.

It is certified that error appears in the above-identified patent and that said Letters Patent is hereby corrected as shown below:

COLUMN 5

Line 11, "is" should read --are--.
　　　Line 51, "are" should read --is--.

COLUMN 6

Line 18, "and" should be deleted.
　　　Line 32, "and" should be deleted.
　　　Line 35, "mettalic" should read --metallic--.
　　　Line 37, "In" should read --¶ In--.
　　　Line 40, "an" should read --a--.

COLUMN 7

Line 8, "1 X $10^{-2}$Torr." should read --1X$10^{-2}$ Torr.--
　　　Line 43, "11. And" should read --11 and--.

COLUMN 9

Line 4, "an" should read --a--.
　　　Line 51, "as much" should read --than--.
　　　Line 52, "as" should be deleted.
　　　Line 62, "a" should be deleted.
　　　Line 67, "02 gas" should read --$O_2$ gas--.

UNITED STATES PATENT AND TRADEMARK OFFICE
CERTIFICATE OF CORRECTION

PATENT NO. : 4,931,308

DATED : June 5, 1990

INVENTOR(S) : ISAMU SHIMIZU, ET AL.

Page 3 of 3

It is certified that error appears in the above-identified patent and that said Letters Patent is hereby corrected as shown below:

COLUMN 11

Line 30, "structually" should read --structurally--.
    Line 48, "230°C." should read --about 230°C.--.

Signed and Sealed this

First Day of December, 1992

Attest:

DOUGLAS B. COMER

Attesting Officer

Acting Commissioner of Patents and Trademarks